United States Patent
Kumar et al.

(10) Patent No.: US 8,421,516 B2
(45) Date of Patent: Apr. 16, 2013

(54) APPARATUS AND METHOD PROVIDING AN INTERFACE BETWEEN A FIRST VOLTAGE DOMAIN AND A SECOND VOLTAGE DOMAIN

(75) Inventors: Nidhir Kumar, Bangalore (IN); Sridhar Cheruku, Bangalore (IN); Manjunatha Govinda Prabhu, Bangalore (IN)

(73) Assignee: ARM Limited, Cambridge (GB)

( * ) Notice: Subject to any disclaimer, the term of this patent is extended or adjusted under 35 U.S.C. 154(b) by 324 days.

(21) Appl. No.: 12/656,909

(22) Filed: Feb. 18, 2010

(65) Prior Publication Data

US 2011/0095804 A1    Apr. 28, 2011

(30) Foreign Application Priority Data

Oct. 23, 2009   (IN) .......................... 2198/DEL/2009

(51) Int. Cl.
*H03L 5/00*    (2006.01)
(52) U.S. Cl.
USPC ............................... 327/333; 326/62; 326/81
(58) Field of Classification Search .............. 326/62–63, 326/80–81; 327/306, 333
See application file for complete search history.

(56) References Cited

U.S. PATENT DOCUMENTS

| | | | |
|---|---|---|---|
| 6,768,368 B2 * | 7/2004 | Kaneko et al. | 327/333 |
| 7,619,444 B1 * | 11/2009 | Shaikh et al. | 326/81 |
| 8,106,699 B2 * | 1/2012 | Shankar et al. | 327/333 |

* cited by examiner

*Primary Examiner* — Dinh T. Le
(74) *Attorney, Agent, or Firm* — Nixon & Vanderhye P.C.

(57) ABSTRACT

An interface between first and second voltage domains is provided. A level shifter is configured to receive an input signal from the first voltage domain and to level shift the input signal to provide an output signal for passing to the second voltage domain. A control signal generator is configured to generate a second voltage domain control signal in dependence on at least one first voltage domain control signal from a controller in the first voltage domain. The level shifter is configured to be in a retention state when the second voltage domain control signal has a first value, such that its output signal is held constant even when the controller becomes not actively driven by the first voltage supply. The level shifter is configured to be in a transmission state when the second voltage domain control signal has a second value, wherein the output signal depends on the input signal.

24 Claims, 9 Drawing Sheets

APPARATUS AND METHOD PROVIDING AN INTERFACE BETWEEN A FIRST VOLTAGE DOMAIN AND A SECOND VOLTAGE DOMAIN

This application claims priority to Indian Application No. 2198/DEL/2009 filed 23 Oct. 2009, the entire contents of which is incorporated herein by reference.

BACKGROUND OF THE INVENTION

1. Field of the Invention

The present invention relates to an interface between a first voltage domain and a second voltage domain. More particularly, this invention relates to such interfaces which are configured to retain data.

2. Description of the Prior Art

Contemporary system-on-chip (SoC) devices are commonly designed to consume as little power as possible. This has clear advantages, for example when the SoC is implemented in mobile or hand-held devices the battery life is prolonged. One aspect of such design is that the SoC is typically arranged to be powered by as low a voltage supply as can be tolerated, whilst still ensuring correct functionality of the SoC components. Contemporary SoC voltage supplies are commonly below 1V (e.g. VDD=0.7V).

Although the SoC itself may operate in such a low voltage domain, it is often the case that the SoC must communicate with other off-chip components which operate in a higher voltage domain (e.g. DVDD=2V). For this reason it is known to provide an interface between the low and high voltage domains (i.e. on the edge of the chip) to transform low voltage on-chip signals from the SoC into higher voltage signals suitable for the off-chip high voltage domain (and vice versa). This interface is typically provided by a set of I/O drivers arranged around the periphery of the SoC (an "I/O ring") under the control of an I/O controller, which itself forms part of the SoC. Each I/O driver may be connected to a pad on the edge of the SoC which forms the physical connection to off-chip devices.

A further aspect of the low power design of contemporary SoC devices is that it is commonly arranged that at least part of the SoC can be powered down when not in use to reduce power consumption. This power down may be partial, only selectively powering down components of the SoC that are not in use and are not required to be active, or it may be complete, with the entire SoC being switched off.

Nevertheless, a requirement of some such SoC systems is that data at the interface between the on-chip low voltage domain and the off chip high voltage domain is retained, even when the on-chip components providing the low voltage signals are powered down. For example a display driver may need to continuously drive the same signal, to maintain a particular part of a display in a given state, despite the on-chip component originally driving that signal having been switched off. One manner of implementing this feature is to arrange the I/O ring to enter a retention state, in which the signals that the I/O drivers output to their respective pads are maintained at the values they had before the I/O ring entered the retention state, regardless of subsequent changes in the input signals they receive. In particular, the output signals are maintained, even when the components of the SoC supplying the input signals are powered down.

This functionality is typically achieved by the I/O controller supplying a signal to the I/O ring to drive it into its retention state. Subsequently, when the I/O ring is required to return to its normal transmission state, this is also signalled by the I/O controller. Consequently the I/O controller is required to be a "live core" component, which cannot be powered down with other parts of the SoC, such that the correct control of the I/O ring is provided.

It would be desirable to provide an improved technique for retaining such interface data.

SUMMARY OF THE INVENTION

Viewed from a first aspect, the present invention provides apparatus providing an interface between a first voltage domain and a second voltage domain, first voltage components in said first voltage domain connected to a first voltage supply and second voltage components in said second voltage domain connected to a second voltage supply, said apparatus comprising: a level shifter configured to receive an input signal from said first voltage domain and to level shift said input signal to provide an output signal for passing to said second voltage domain; and a control signal generator configured to generate a second voltage control signal in said second voltage domain in response to at least one first voltage control signal from a controller in said first voltage domain, wherein said level shifter is configured to be in a retention state when said second voltage control signal has a first value, in which said output signal provided by said level shifter is held constant, wherein said level shifter is configured to be in a transmission state when said second voltage control signal has a second value, in which said output signal depends on said input signal, and wherein said control signal generator is configured, if whilst generating said second voltage control signal with said first value said controller becomes not actively driven by said first voltage supply, to maintain said second voltage control signal at said first value.

According to the arrangement of the present invention, the apparatus provides an interface between a first voltage domain and a second voltage domain. A level shifter forms part of the apparatus and is configured to receive an input signal from the first voltage domain and to level shift the input signal to provide an output signal for passing to the second voltage domain. The level shifter is furthermore configured to be responsive to a second voltage control signal (i.e. a control signal in the second voltage domain) to switch between a retention state and a transmission state. When the level shifter is in its retention state, the output signal provided by the level shifter is held constant. On the other hand, when the level shifter is in its transmission state, the output signal depends on the input signal. The second voltage control signal is generated by a control signal generator in the second voltage domain in dependence on at least one first voltage control signal from a controller (typically an I/O controller) in the first voltage domain. The control signal generator is configured such that if the controller becomes not actively driven by the first voltage supply whilst the control signal generator is generating the second voltage control signal with the first value, it will continue to generate the second voltage control signal with the first value. The controller becoming not actively driven by the first voltage supply could, for example, be due to either the controller itself or the first voltage supply being turned off, or could be due to the first voltage supply being allowed to float.

Accordingly, the level switcher is switched between its transmission and its retention state in dependence on a control signal which does not form part of the first voltage domain and consequently the control of the switching of the level shifter between its states is not directly sensitive to the current status of the first voltage domain. In particular, if the level shifter is in its retention state (due to the second voltage control signal having its first value), it will remain in the retention state even if the controller in the first voltage domain becomes not actively driven by said first voltage supply.

In this way the functionality of data retention is provided at the interface between the first voltage domain and the second voltage domain, yet the correct transition of the level shifter in and out of its retention state does not directly depend on a first voltage domain control signal. Hence even the entirety of the first voltage domain can be powered down, without compromising the data retention functionality at the interface.

In one embodiment, the control signal generator is configured, if whilst generating said second voltage control signal with said second value said controller becomes not actively driven by said first voltage supply, to maintain said second voltage control signal at said second value. This means that if the level shifter is in its transmission state, and the controller becomes not actively driven by the first voltage supply, the level shifter will remain in its transmission state. This may be desired if the entire system is shutting down, and despite the controller being switched off there is no desire to retain data at the interface.

The at least one first voltage control signal may take a number of forms, but in one embodiment said at least one first voltage control signal comprises an enabling first voltage control signal and said control signal generator is configured to generate said second voltage control signal with said first value in response to said enabling first voltage control signal. This enabling first voltage control signal can thus be used to cause the control signal generator to switch the level shifter out of its transmission state and into its retention state. Providing a first voltage control signal that only enables the retention state ensures a more clearly defined transition into the retention state, which is less sensitive to signal noise.

In one embodiment said at least one first voltage control signal comprises a disabling first voltage control signal and said control signal generator is configured to generate said second voltage control signal with said second value in response to said disabling first voltage control signal. This disabling first voltage control signal can thus be used to cause the control signal generator to switch the level switcher out of its retention state and into its transmission state. Providing a first voltage control signal that only disables the retention state ensures a more clearly defined transition into the transmission state, which is less sensitive to signal noise.

The control signal generator may take a number of forms, but in embodiments of the present invention the control signal generator comprises latch circuitry. The latch circuitry may be configured to hold said second voltage control signal at said first value following assertion of said enabling first voltage control signal. According to this arrangement once the enabling first voltage control signal has caused the control signal generator to generate the second voltage control signal at the first value, the latch circuitry arrangement will ensure that the second voltage control signal is held at that first value (keeping the level shifter in its retention state) even if the first voltage supply is switched off (thus causing the enabling first voltage control signal to also be turned off). The latch circuitry may be configured to hold said second voltage control signal at said second value following assertion of said disabling first voltage control signal. According to this arrangement once the disabling first voltage control signal has caused the control signal generator to generate the second voltage control signal at the second value, the latch circuitry arrangement will ensure that the second voltage control signal is held at that second value holding the level shifter in its transition state.

According to embodiments of the present invention, the apparatus further comprises second voltage supply detection circuitry configured to provide a second voltage supply threshold signal when said second voltage supply exceeds a predetermined threshold, wherein at least one component of said control signal generator is configured only to be enabled when said second voltage supply threshold signal is provided. By arranging that at least one component of the control signal generator is configured only to be enabled when this second voltage supply threshold signal is provided, glitches that might otherwise occur (undesired switching) in the apparatus may be avoided during the ramping up and down of the second voltage supply. In one embodiment said component of said control signal generator comprises a connection to said second voltage supply. In this way the second voltage supply itself is not connected to the control signal generator until it has exceeded a predetermined threshold and unpredictable behaviour of the controlled signal generator can thus be avoided. In embodiments of the invention said component of said control signal generator comprises at least one switch operated by said at least one first voltage control signal. In this way unpredictable behaviour of the apparatus dependent on the status of this at least one switch operated by the at least one first voltage control signal may be avoided.

In embodiments of the present invention at least one component of said level shifter is configured only to be enabled when said second voltage control signal has said second value. According to this configuration this at least one component of the level shifter will only be enabled when the level shifter is in its transmission state. The retention state is typically entered when the first voltage domain components of the apparatus are to be powered down. Powering down first voltage domain components may leave their outputs in floating, and hence unpredictable, states which could lead to leakage currents and/or unwanted switching. This disabling of at least one component of the level shifter in its retention state helps to cut down current leakage in that powered down state and to avoid unwanted switching. In one embodiment said at least one component of said level shifter comprises at least one switch operated by said input signal. Since the state of the input signal is disregarded when the level shifter is in its retention state, it is advantageous to disable at least one switch operated by the input signal and to thus avoid any current leakage or unwanted switching that could be associated therewith.

The level shifter could take a variety of forms but according to one embodiment the level shifter forms part of an input-output driver. An input-output driver (I/O driver) is typically arranged to provide the interface to the second voltage domain for a single signal, but according to one embodiment the apparatus comprises an input-output ring. An input-output ring (I/O ring) arrangement provides for convenient control over a number of I/O drivers linked together in this manner.

In embodiments of the present invention at least one component in said first voltage domain is power gated. Power gating provides that when a component of the first voltage domain is powered down, the isolation of the power supply from that component helps to avoid current leakage through that component, despite it not formally operating. A range of components in the first voltage domain could be power gated in order to reduce power consumption in this manner, but in one embodiment said at least one component is said controller. Alternatively or in addition said at least one component is configured to generate said input signal.

In one embodiment said first voltage components are system-on-chip components.

In some embodiments, said first voltage domain is a lower voltage domain and said second voltage domain is a higher voltage domain; said first voltage supply is a lower voltage supply and said second voltage supply is a higher voltage supply; and said first voltage control signal is a lower voltage control signal and said second voltage control signal is a higher voltage control signal.

In other embodiments, said first voltage domain is a higher voltage domain and said second voltage domain is a lower voltage domain; said first voltage supply is a higher voltage supply and said second voltage supply is a lower voltage supply; and said first voltage control signal is a higher voltage control signal and said second voltage control signal is a lower voltage control signal.

As stated above, the controller becoming not actively driven by the first voltage supply could have a number of causes. In one embodiment, said controller becoming not actively driven by said first voltage supply comprises said controller being switched off. In other words, the first voltage supply might may remain on, supplying other components in the first voltage domain, but the controller may be switched off. In another embodiment, said controller becoming not actively driven by said first voltage supply comprises said first voltage supply being switched off. Here the whole first voltage domain is powered down, since the first voltage supply is switched off. In yet another embodiment said controller being not actively driven by said first voltage supply comprises an input voltage to said controller being allowed to float. Here the controller receives an input voltage which is in an undefined, i.e. floating state. This could be due to the first voltage supply itself being allowed to float, or merely because the controller is decoupled from the first voltage supply in a manner which leaves its input voltage undefined.

According to a second aspect, the present invention provides apparatus providing an interface between a first voltage domain and a second voltage domain, first voltage components in said first voltage domain connected to a first voltage supply and second voltage components in said second voltage domain connected to a second voltage supply, said apparatus comprising: level shifting means for receiving an input signal from said first voltage domain and level shifting said input signal to provide an output signal for passing to said second voltage domain; and control signal generation means for generating a second voltage control signal in said second voltage domain in response to at least one first voltage control signal from a controller means in said first voltage domain, wherein said level shifting means is configured to be in a retention state when said second voltage control signal has a first value, in which said output signal provided by said level shifter is held constant, wherein said level shifting means is configured to be in a transmission state when said second voltage control signal has a second value, in which said output signal depends on said input signal, and wherein said control signal generation means is configured, if whilst generating said second voltage control signal with said first value said controller means becomes not actively driven by said first voltage supply, to maintain said second voltage control signal at said first value.

According to a third aspect the present invention provides a method of providing an interface between a first voltage domain and a second voltage domain, first voltage components in said first voltage domain connected to a first voltage supply and second voltage components in said second voltage domain connected to a second voltage supply, said method comprising the steps of: receiving at a level shifter an input signal from said first voltage domain; level shifting said input signal to provide an output signal for passing to said second voltage domain; generating a second voltage control signal in said second voltage domain in response to at least one first voltage control signal from a controller in said first voltage domain; putting said level shifter into a retention state when said second voltage control signal has a first value, in which said output signal provided by said level shifter is held constant, putting said level shifter into a transmission state when said second voltage control signal has a second value, wherein said output signal depends on said input signal, and if whilst generating said second voltage control signal with said first value said controller becomes not actively driven by said first voltage supply, maintaining said second voltage control signal at said first value.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
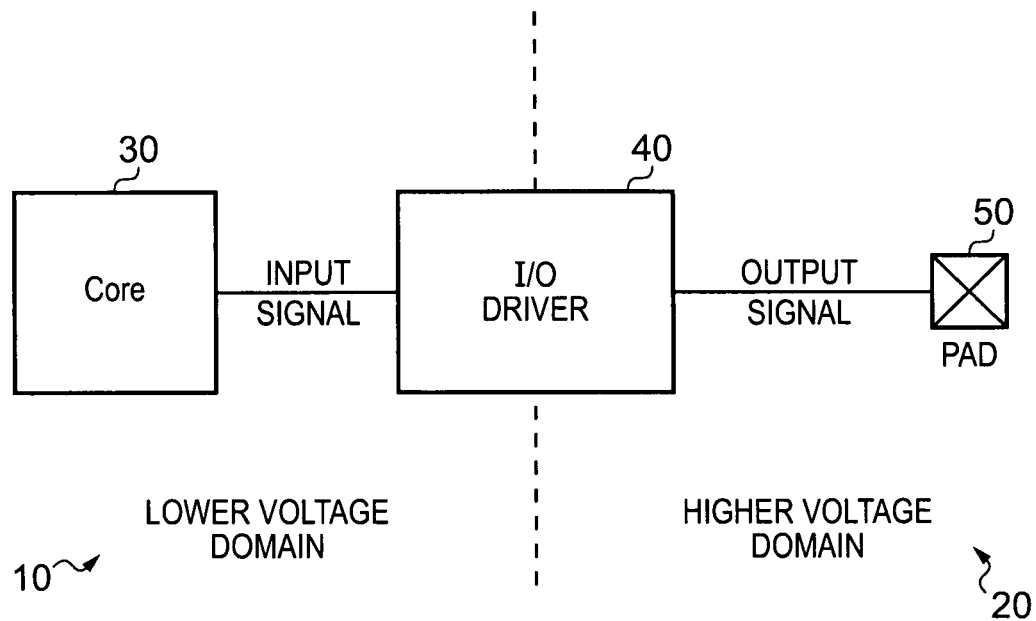
FIG. 1 schematically illustrates an I/O driver providing an interface between a lower voltage domain and a higher voltage domain in one embodiment.

FIG. 1 schematically illustrates a lower voltage domain 10 adjacent to a higher voltage domain 20. Situated within lower voltage domain 10 is core 30 which performs various data processing operations. Core 30 is a low power system-on-chip (SoC) component designed to consume as little electrical power as possible. By operating in this lower voltage domain 10 (which in this example comprises a range of 0V to 0.7V), the core 30 can perform its data processing operations with very little consumption of electrical power. However, in order to communicate with off-chip components, it is necessary for signals from the core 30 to be transformed into signals suitable for propagation in higher voltage domain 20. This occurs by core 30 passing an input signal to I/O driver 40 which converts the input signal into an output signal in the higher voltage domain 20 and passing it to pad 50. I/O driver 40 thus acts as a level shifter, converting a lower voltage domain signal into a higher voltage domain. In the following, generally the term I/O driver is used, except where distinction is required between its subcomponents.

In order to reduce power consumption, core 30 is further configured to be able to be powered down (either in part or fully) when not required to perform data processing operations. However, when core 30 powers down it is required that the output signal seen on pad 50 remains unchanged. For this reason I/O driver 40, which provides the interface between the lower voltage domain 10 and the higher voltage domain 20, is arranged to be able to enter a retention state in which it holds the state of the output signal it passes to pad 50 constant, as will be described in more detail in the following figures.

In alternative embodiments, the I/O driver may provide the interface between a higher voltage domain from which it receives an input signal, and a lower voltage domain for which it generates an output signal. In other words, the level shifting performed by the I/O driver can be a down-shifting, as opposed to the up-shifting illustrated in FIG. 1.

Figure 2A:
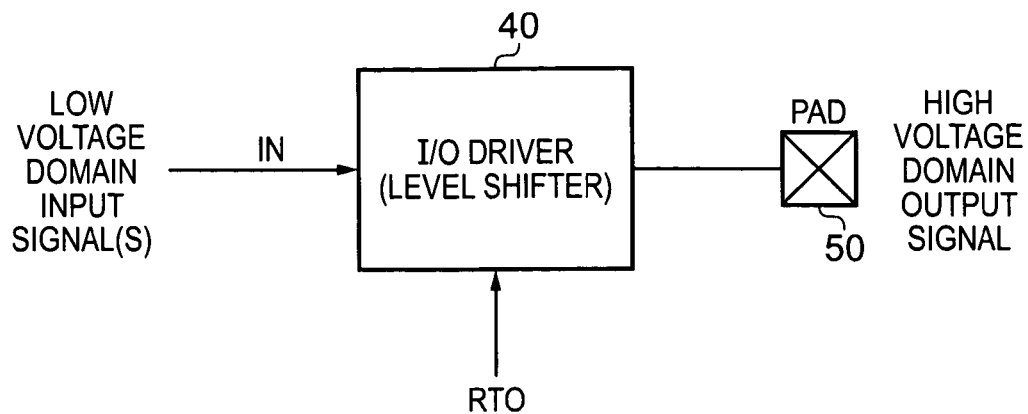
FIG. 2A schematically illustrates an I/O driver (level shifter) according to one embodiment.

FIG. 2A is another schematic illustration of I/O driver 40 shown in FIG. 1, which provides the interface between lower voltage domain 10 and higher voltage domain 20. I/O driver (level shifter) 40 is configured to transform the low voltage domain input signal IN into a signal in the high voltage domain which is output onto pad 50. I/O driver 40 is configured to be either in a transmission state or a retention state in dependence on the control signal RTO it receives. When I/O driver 40 is in its transmission state it level shifts the low voltage domain input signal IN into a high voltage domain output signal which is passed to pad 50. Conversely, when I/O driver 40 is in its retention state the output signal passed to pad 50 is held constant, regardless of the state of the low voltage domain input signal IN. In other words, the output signal is held at the value into which the input signal was being transformed before the control signal RTO caused I/O driver 40 to enter its retention state.

Figure 2B:
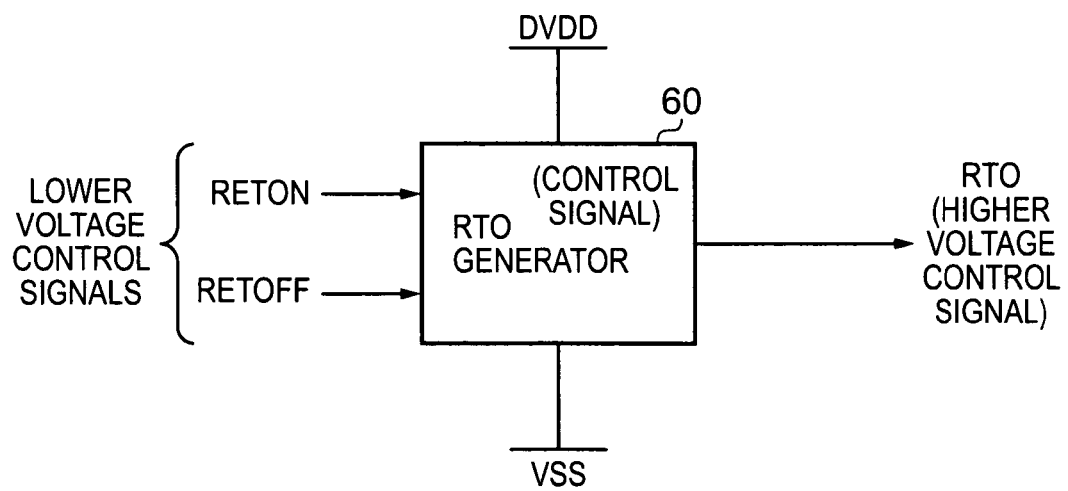
FIG. 2B schematically illustrates a control signal generator in one embodiment.

The control signal RTO is generated by control signal generator 60 schematically illustrated in FIG. 2B. Control signal generator 60 forms part of the higher voltage domain, being connected between VSS and DVDD. It receives two lower voltage control signals RETON and RETOFF from the lower voltage domain, and generates the control signal RTO (a higher voltage control signal) for use in the higher voltage domain. The generation and use of the control signal RTO is discussed with reference to the following figures.

Figure 3:
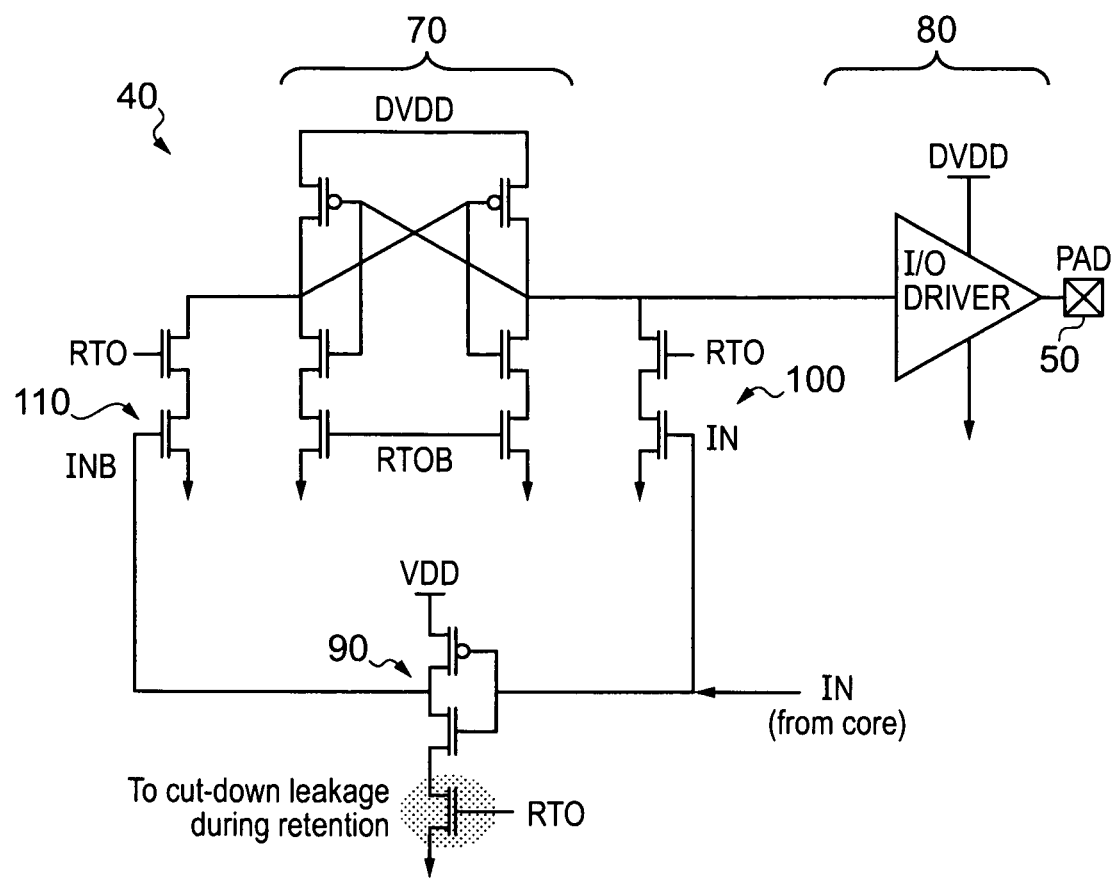
FIG. 3 schematically illustrates a level shifter and I/O driver according to one embodiment.

FIG. 3 schematically illustrates in more detail the components of I/O driver 40. Since I/O driver 40 spans the lower voltage domain and higher voltage domain, it can be seen in FIG. 3 that some components are connected to the lower voltage supply VDD, whilst other components are connected to the higher voltage supply DVDD. In this embodiment VDD=0.7V and DVDD=2V.

The two main sub-components illustrated in FIG. 3 are level shifter 70 and I/O driver 80. Level shifter 70 is configured to be in either a retention state or a transmission state in dependence on control signal RTO. When control signal RTO is high, level shifter 70 is in its transmission state and the input signal IN received from the core is translated from a lower voltage domain (VDD) range signal to a higher voltage domain (DVDD) range signal. The I/O driver 80 passes this signal to pad 50. Conversely, when RTO is low the level shifter 70 is in its retention state and the signal passed to I/O driver 80 remains in the same state as it was before the control signal RTO switched from high to low. Whilst level shifter 70 is in its retention state, the signal output to pad 50 is independent of the input signal IN or the status of the lower voltage supply VDD.

FIG. 3 further illustrates inverter 90 which provides the conjugate signal INB from input signal IN. Note that when RTO is low both of the input signal switches 100 and 110 are disabled, as is inverter 90. Isolating the switches in this manner helps to reduce leakage currents and/or unwanted switching during the retention state.

Figure 4A:
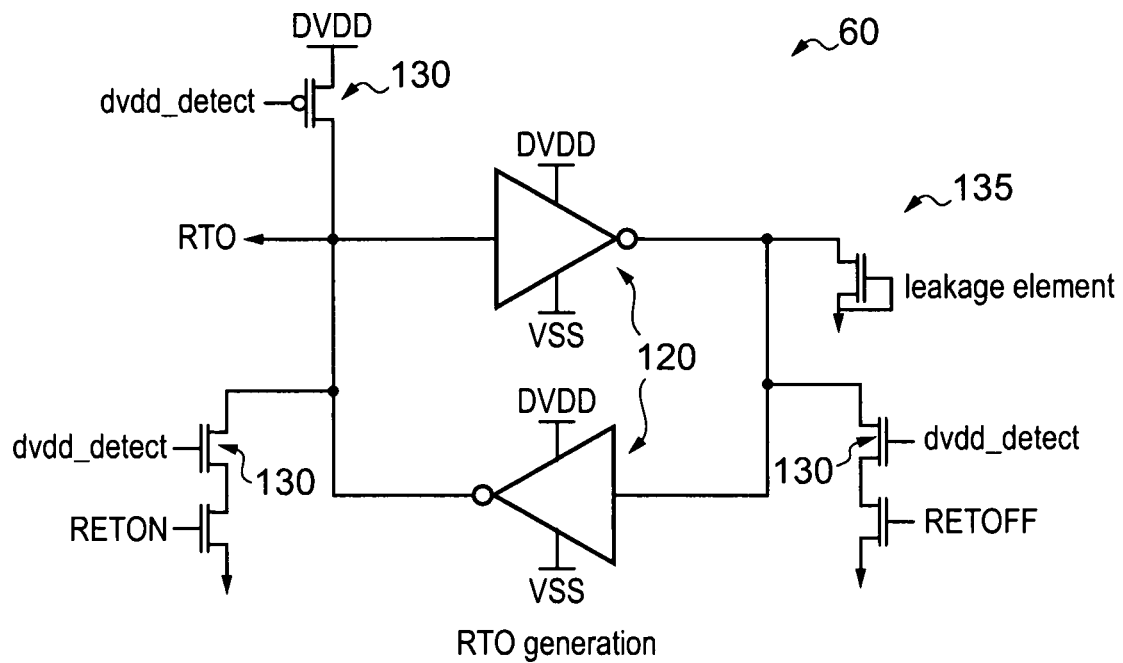
FIG. 4A schematically illustrates a control signal generator according to one embodiment.

The generation of control signal RTO is now discussed in more detail with reference to FIG. 4A. Control signal (RTO) generator 60 comprises latch circuitry controlled by the lower voltage control signals RETON and RETOFF. The cross-coupled inverters 120 serve to provide this latch circuitry and hold the control signal RTO either at the level of DVDD (2V) or at the level of VSS (0V). Hence, when RETON makes a transition from low to high (i.e. from VSS to VDD) RTO switches to its low (VSS) state. Conversely, when RETOFF makes a transition from low to high, RTO switches to its high (DVDD) state. It should be noted that RTO generation circuitry 60 is further provided with three enabling switches 130 controlled by the signal DVDD_DETECT. This higher voltage supply threshold signal DVDD_DETECT is active when the higher voltage supply (DVDD) itself exceeds a predetermined threshold. The provision of these three enabling switches 130 thus ensures that the RTO generation circuitry 60 does not become active until a sufficiently high voltage is present as the higher voltage supply (DVDD). Consequently, glitches which could otherwise occur during ramping up and ramping down of DVDD are avoided. Leakage element 135 provides a leakage path such that unwanted charge build-up at this node does not occur.

Figure 4B:
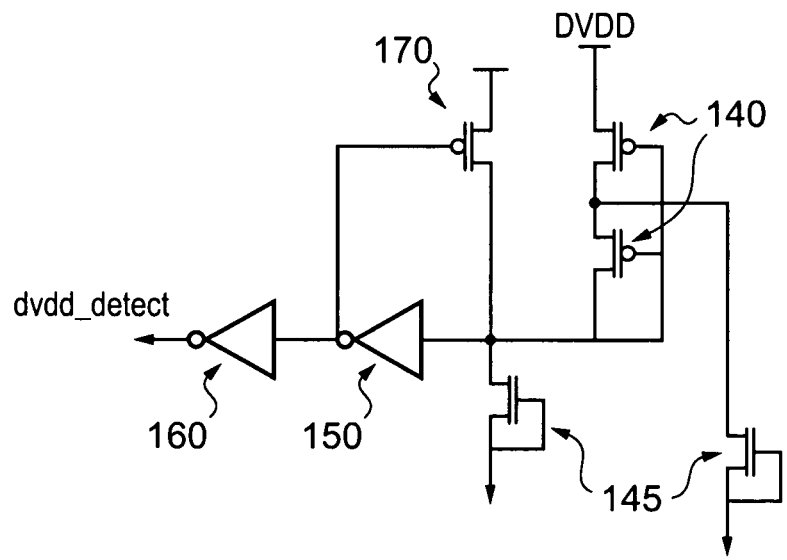
FIG. 4B schematically illustrates a higher voltage supply detection circuitry according to one embodiment.

The generation of the signal DVDD_DETECT is now described with reference to FIG. 4B. When DVDD is off, DVDD_DETECT remains low (inactive). Once DVDD rises above the predetermined threshold (determined by the threshold voltages of PMOS transistors 140), this results in an input to inverter 150 which is sufficiently high for its output to switch to low and thus the output of inverter 160 provides the signal DVDD_DETECT as a high (active) signal. PMOS transistor 170, gated by the output of inverter 150, provides a positive feedback latching mechanism to hold the DVDD_DETECT signal in a steady state. Leakage paths are provided by leakage elements 145, to avoid charge build up at the illustrated nodes, which could otherwise lead to unwanted glitches in the output.

Figure 5:
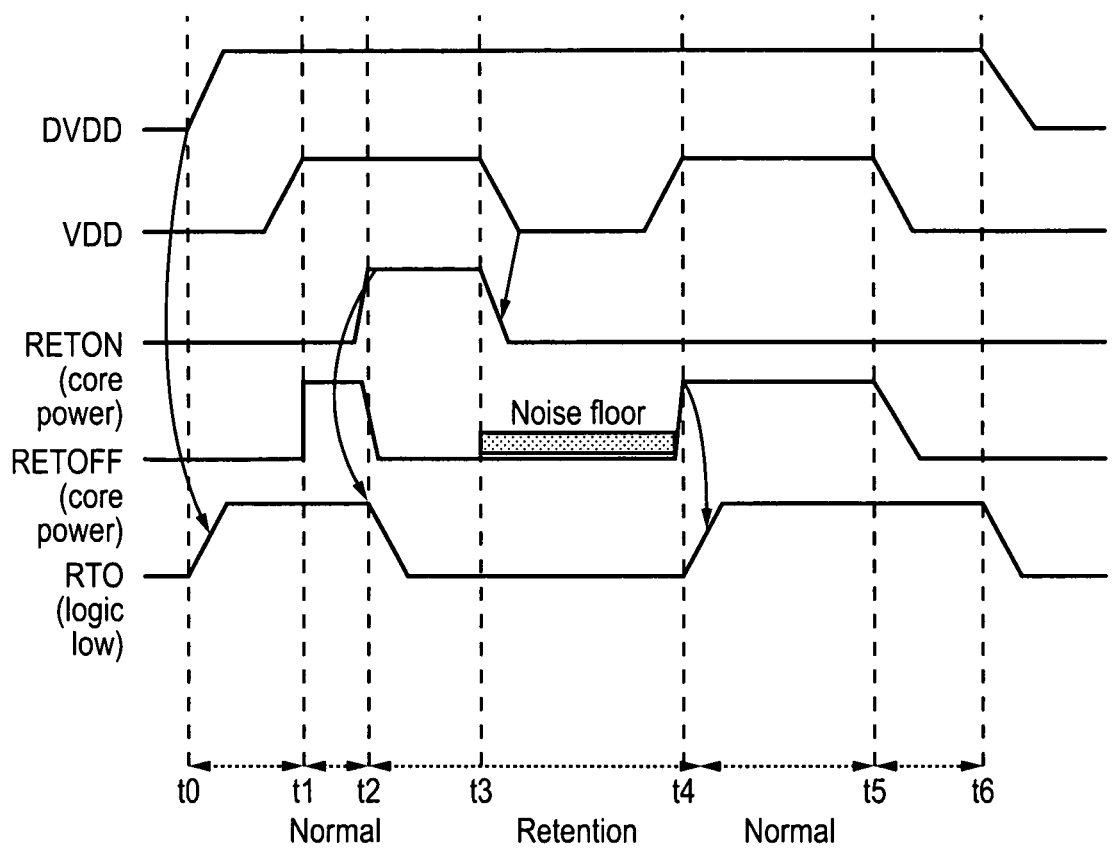
FIGS. 5, 6 and 7 schematically illustrate the relative timings of various signals in embodiments of the present invention.

FIG. 5 schematically illustrates the interrelationship between the power supplies DVDD and VDD, and the control signals RETON, RETOFF and RTO. Initially (at time $t_0$) both the higher voltage supply (DVDD) and the lower voltage supply (VDD) are off and consequently all three control signals RETON, RETOFF and RTO are in their low state. Beginning at time $t_0$, the system is switched on and DVDD ramps up, causing RTO to also ramp up its high value. At this time VDD remains low, i.e. the core remains powered down. Shortly before time $t_1$ (VDD) begins to ramp up, i.e. the core is instructed to power up. At time $t_1$ the core is powered and immediately thereafter the core asserts the signal RETOFF, indicating that the level shifter is required to be in its transmission state, translating lower voltage signals from the core (in the lower voltage domain) into output signals for passing to the higher voltage domain.

Next, at time $t_2$, the core asserts the control signal RETON and deasserts the control signal RETOFF, indicating that the level shifter is required to enter its retention state. Asserting RETON causes the control signal RTO to then transition into its low state, thus putting the level shifter into its retention state. The level shifter is then in its retention state and at time $t_3$ the core powers down (VDD ramps down), causing the core signal RETON to also ramp down. Hence the core is then powered off, whilst the level shifter is in a retention state such that it continues to assert the output signal on the pad corresponding to the input signal it was receiving when the change in state of signal RTO at time $t_2$ caused it to enter its retention state. The apparatus is arranged such that the level shifter will not return to its transmission state until RETOFF is asserted by the core, causing control signal RTO to transition into its high state. In FIG. 5 it is illustrated that a noise floor exists between times $t_3$ and $t_4$, but this does not cause RTO to transition. This will be discussed in more detail with reference to FIGS. 6 and 7.

Shortly before time $t_4$, the core powers up, i.e. VDD ramps up, and at time $t_4$ once powered the core immediately asserts its control signal RETOFF indicating that the level shifter should exit the retention state and enter the transition state. The assertion of RETOFF causes RTO to ramp up and the level shifter is then its normal transmission state. Note that the period between $t_3$ and $t_4$ is labelled as "Retention" in FIG. 5, since although the level shifter already enters is retention state shortly after $t_2$ (when RTO goes low), after $t_3$ is the period in which the core is off, yet the output state is held by the level shifter, i.e. true retention.

It is also possible for the core to power down without the level shifter entering the retention state—for example when the whole system is shutting down. This is illustrated by the transitions at $t_5$ and $t_6$. At time $t_5$ the core begins to power down (i.e. VDD ramps down) causing control signal RETOFF to also ramp down. Note however that control signal RETON has not been asserted and therefore control signal RTO remains high (and thus the level shifter remains in its transmission state). The requirement for the level shifter to enter the retention state is not required here because the entire system is shutting down and at time $t_6$ the DVDD ramps down, at which point control signal RTO also ramps down. Thereafter the whole system is powered off.

Figure 6:
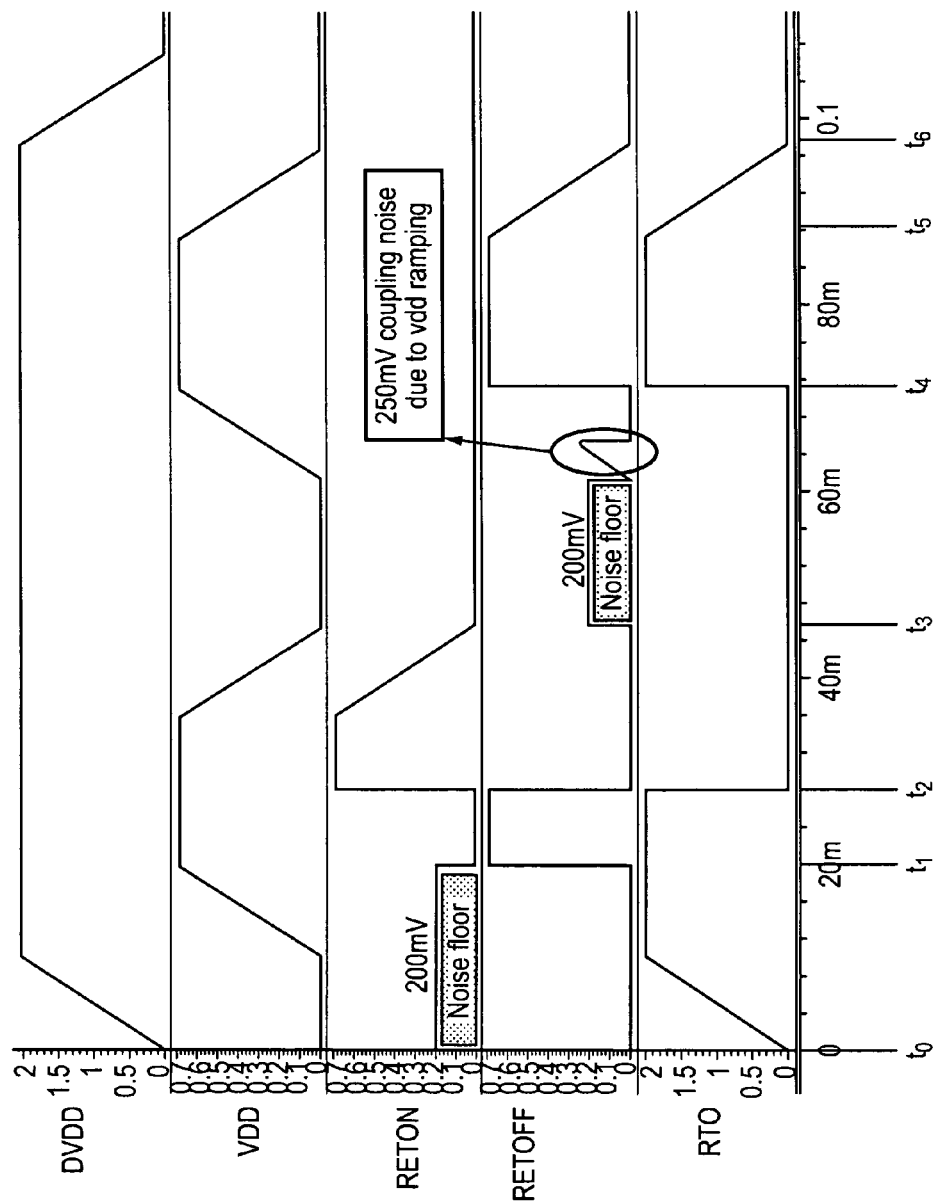
Figure 7:
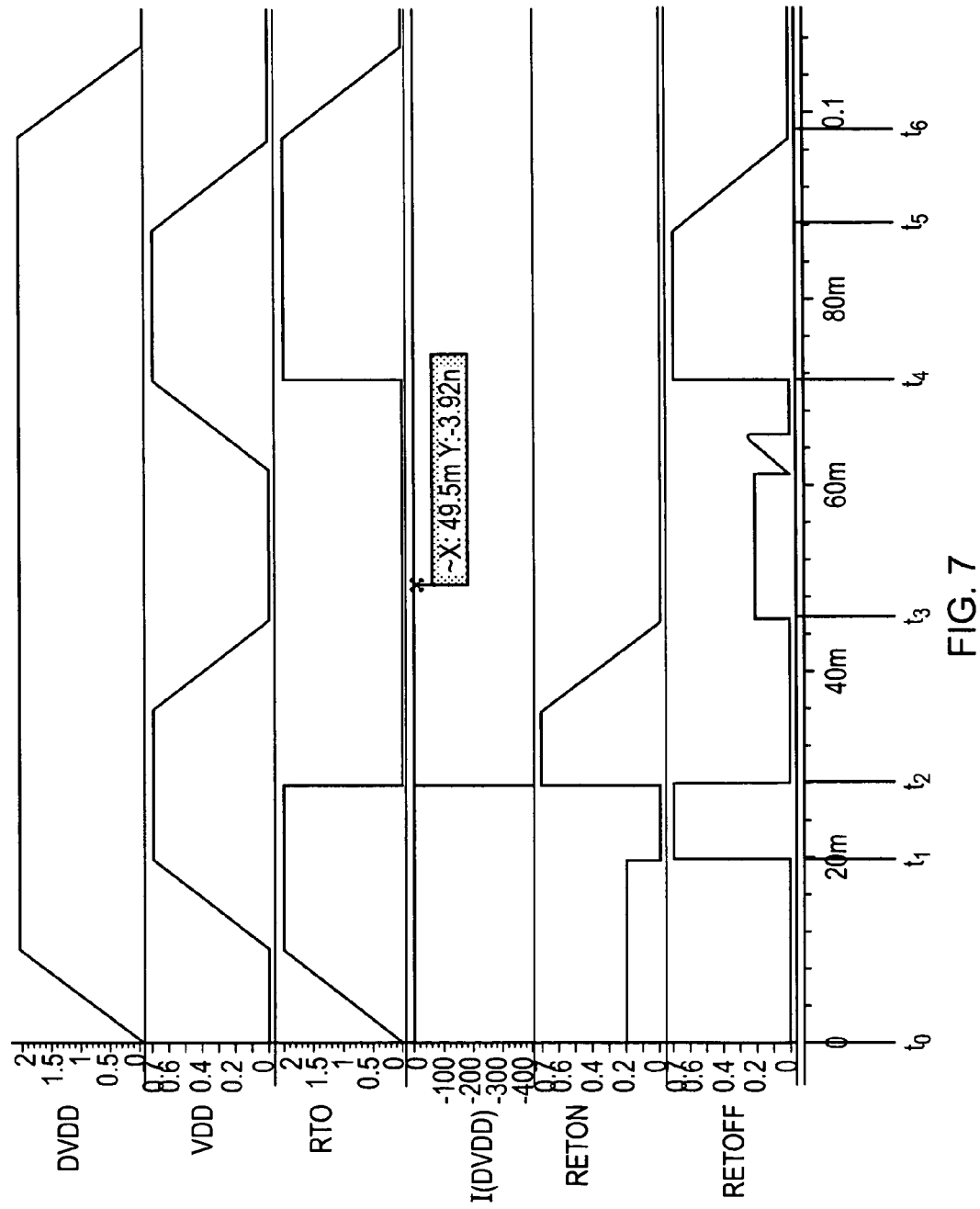

FIGS. 6 and 7 illustrate simulation results for an apparatus according to one embodiment. Both figures illustrate the same progression of the same voltage supply and control signal changes as discussed with reference to FIG. 5 (using corresponding time markers $t_0$-$t_6$). FIG. 6 illustrates that a noise floor of 200 mV (between $t_0$ and $t_1$) on RETON does not cause control signal RTO to transition to its low state. Similarly, a noise floor of 200 mV (between $t_3$ and $t_4$) on control signal RETOFF does not cause control signal RTO to transition to its high state. In addition, a 250 mV peak in RETOFF between $t_3$ and $t_4$ caused by coupling noise (as VDD ramps) does not cause control signal RTO to transition to its high state.

FIG. 7 further illustrates the trace of I(DVDD), i.e. indicating the current leakage associated with the higher voltage supply. As indicated by the trace marker, when the level shifter is in its retention state (between $t_3$ and $t_4$) the current drawn (in this example) is less than 4 nA, indicating that very little steady state current leakage is occurring. The value of the leakage current in any given implementation will of course be dependent on the process, the temperature etc.

Figure 8:
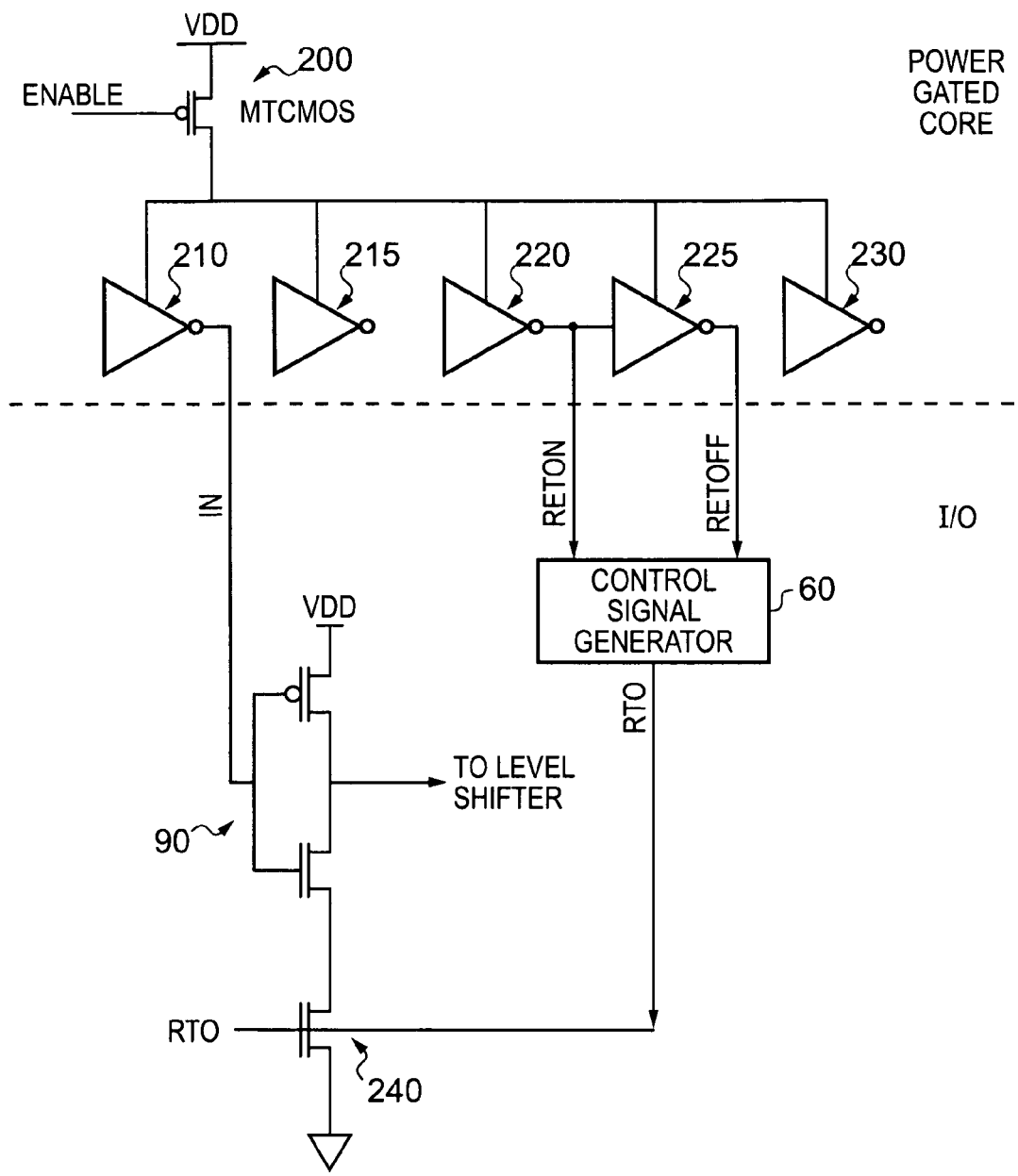
FIG. 8 schematically illustrates power gated components of a core connected to various I/O components in one embodiment.

FIG. 8 schematically illustrates the power gating of various components in the core in one embodiment. A single MTCMOS (multi-threshold CMOS) transistor provides power gating for various components 210, 215, 220, 225 and 230 in the core. Driver 210 provides the signal IN which is passed to the level shifter via inverter 90 (as described with reference to FIG. 3). Drivers 220 and 225 provide the control signals RETON and RETOFF to control signal generator 60 (as described with reference to FIG. 4A). The control signal RTO generated by control signal generator 60 is also used to control the gate of transistor 240, which thus gates the inverter 90. Since the core components illustrated are power gated, all the input signals that they provide to the I/O drivers are undefined during the retention mode (when the core is powered down). If the same VDD supply is used in the core and in the I/O drivers, there could be a leakage path between VDD and VSS in all logic gates whose inputs are driven from the core and are undefined (floating). Whilst these inputs are floating, there is a potential direct leakage path between VDD and VSS. For this reason, to avoid leakage or switching currents during the retention state, all the logic gates between VDD and VSS inside the I/O driver are gated with RTO as shown in FIG. 3.

Figure 9:
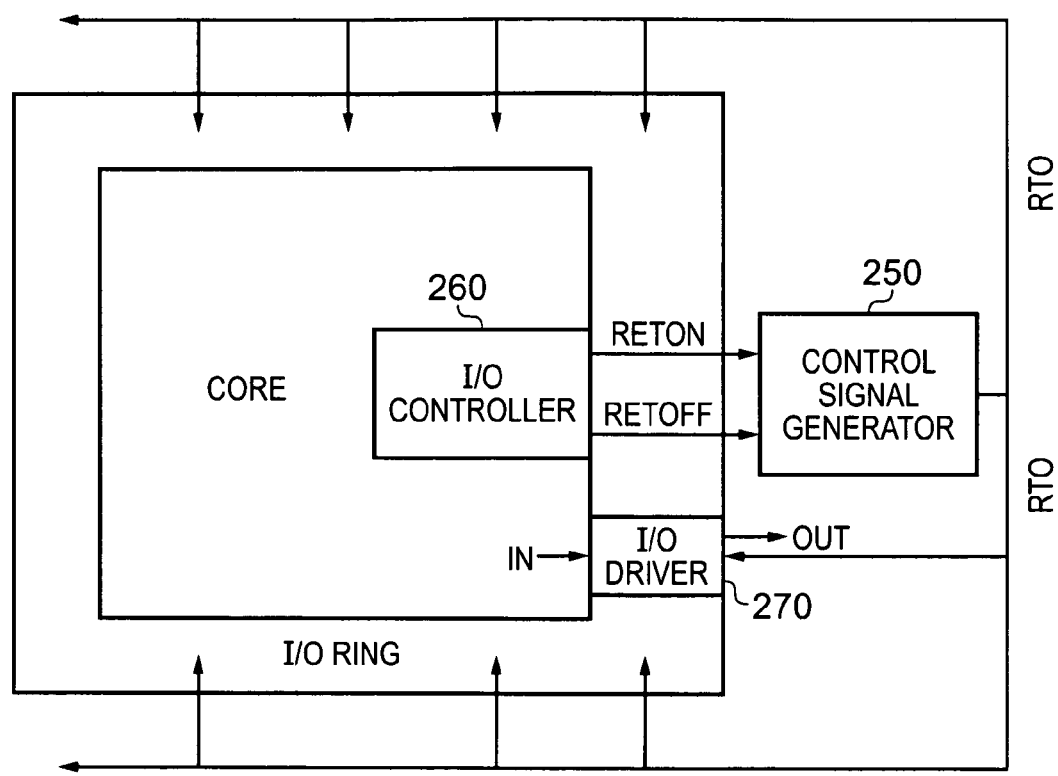
FIG. 9 schematically illustrates a control signal generator providing a higher voltage control signal for an I/O ring according to one embodiment.

FIG. 9 schematically illustrates an embodiment in which a single control signal generator 250 provides the control signal RTO for the entire I/O ring of a SoC. Within the SoC an I/O controller 260 within the lower voltage domain provides the lower voltage control signals RETON and RETOFF to control signal generator 250. Accordingly, the I/O controller 260 can be powered down with the remainder of the SoC, whilst the control signal generator 250 maintains the control signal RTO signalling to the I/O ring that it should remain in its retention state (i.e. each I/O driver 270 should continue to assert the signal OUT even in the absence of the input signal IN).

According to the techniques discussed herein, an interface between first and higher voltage domains is provided. A level shifter is configured to receive an input signal from the first voltage domain and to level shift the input signal to provide an output signal for passing to the higher voltage domain. A control signal generator is configured to generate a higher voltage domain control signal in dependence on at least one first voltage domain control signal. The level shifter is configured to be in a retention state when the higher voltage domain control signal has a first value, such that its output signal is held constant even when the first voltage supply is switched off or floated, or if the controller generating the at least one first voltage domain control signal is switched off. The level shifter is configured to be in a transmission state when the higher voltage domain control signal has a second value, wherein the output signal depends on the input signal. Hence, in the example of a SoC arrangement, the requirement for the I/O controller of the SoC to remain live, whilst the remainder powers down (in order to support the retention feature), is avoided. Hence the whole SoC, including the I/O controller, may be turned off, whilst still enabling state retention in the I/O drivers of the I/O ring.

We claim:

1. Apparatus providing an interface between a first voltage domain and a second voltage domain, first voltage components in said first voltage domain connected to a first voltage supply and second voltage components in said second voltage domain connected to a second voltage supply, said apparatus comprising:

a level shifter configured to receive the second supply voltage and an input signal from said first voltage domain and to level shift said input signal to provide an output signal for passing to said second voltage domain; and a control signal generator configured to generate a second voltage control signal in said second voltage domain to said level shifter mean in response to at least one first voltage control signal from a controller coupled to receive the first supply voltage in said first voltage domain, wherein said level shifter is configured to be in a retention state when said second voltage control signal has a first value, in which said output signal provided by said level shifter is held constant at the same value as the value of the output signal before the level shifter was configured to be in the retention state, wherein said level shifter is configured to be in a transmission state when said second voltage control signal has a second value, in which said output signal depends on said input signal, and wherein said control signal generator is configured, if while generating said second voltage control signal with said first value said controller becomes not actively driven by said first voltage supply, to maintain said second voltage control signal at said first value.

2. The apparatus according to claim 1, wherein said control signal generator is configured, if while generating said second voltage control signal with said second value said controller becomes not actively driven by said first voltage supply, to maintain said second voltage control signal at said second value.

3. The apparatus according to claim 1, wherein said at least one first voltage control signal comprises an enabling first voltage control signal and said control signal generator is configured to generate said second voltage control signal with said first value in response to said enabling first voltage control signal.

4. The apparatus according to claim 1, wherein said at least one first voltage control signal comprises a disabling first voltage control signal and said control signal generator is configured to generate said second voltage control signal with said second value in response to said disabling first voltage control signal.

5. The apparatus according to claim 3, wherein said control signal generator comprises latch circuitry, said latch circuitry being configured to hold said second voltage control signal at said first value following assertion of said enabling first voltage control signal.

6. The apparatus according to claim 4, wherein said control signal generator comprises latch circuitry, said latch circuitry being configured to hold said second voltage control signal at said second value following assertion of said disabling first voltage control signal.

7. The apparatus according to claim 1, further comprising second voltage supply detection circuitry configured to provide a second voltage supply threshold signal when said second voltage supply exceeds a predetermined threshold, wherein at least one component of said control signal generator is configured only to be enabled when said second voltage supply threshold signal is provided.

8. The apparatus according to claim 7, wherein said component of said control signal generator comprises a connection to said second voltage supply.

9. The apparatus according to claim 7, wherein said component of said control signal generator comprises at least one switch operated by said at least one first voltage control signal.

10. The apparatus according to claim 1, wherein at least one component of said level shifter is configured only to be enabled when said second voltage control signal has said second value.

11. The apparatus according to claim 10, wherein said at least one component of said level shifter comprises at least one switch operated by said input signal.

12. The apparatus according to claim 1, wherein said level shifter forms part of an input-output driver.

13. The apparatus according to claim 1, wherein said apparatus comprises an input-output ring.

14. The apparatus according to claim 1, wherein at least one component in said first voltage domain is power gated.

15. The apparatus according to claim 14, wherein said at least one component is said controller.

16. The apparatus according to claim 14, wherein said at least one component is configured to generate said input signal.

17. The apparatus according to claim 1, wherein said first voltage components are system-on-chip components.

18. The apparatus according to claim 1, wherein:
said first voltage domain is a lower voltage domain and said second voltage domain is a higher voltage domain;
said first voltage supply is a lower voltage supply and said second voltage supply is a higher voltage supply; and
said first voltage control signal is a lower voltage control signal and said second voltage control signal is a higher voltage control signal.

19. The apparatus according to claim 1, wherein:
said first voltage domain is a higher voltage domain and said second voltage domain is a lower voltage domain;
said first voltage supply is a higher voltage supply and said second voltage supply is a lower voltage supply; and
said first voltage control signal is a higher voltage control signal and said second voltage control signal is a lower voltage control signal.

20. The apparatus according to claim 1, wherein said controller becoming not actively driven by said first voltage supply comprises said controller being switched off.

21. The apparatus according to claim 1, wherein said controller becoming not actively driven by said first voltage supply comprises said first voltage supply being switched off.

22. The apparatus according to claim 1, wherein said controller being not actively driven by said first voltage supply comprises an input voltage to said controller being allowed to float.

23. Apparatus providing an interface between a first voltage domain and a second voltage domain, first voltage components in said first voltage domain connected to a first voltage supply and second voltage components in said second voltage domain connected to a second voltage supply, said apparatus comprising:
level shifting means for receiving the second supply voltage and an input signal from said first voltage domain and level shifting said input signal to provide an output signal for passing to said second voltage domain; and
control signal generation means for generating a second voltage control signal in said second voltage domain to said level shifter in response to at least one first voltage control signal from a controller coupled to receive the first supply voltage means in said first voltage domain,
wherein said level shifting means is configured to be in a retention state when said second voltage control signal has a first value, in which said output signal provided by said level shifter is held constant at the same value as the value of the output signal before the level shifter was configured to be in the retention state,
wherein said level shifting means is configured to be in a transmission state when said second voltage control signal has a second value, in which said output signal depends on said input signal, and
wherein said control signal generation means is configured, if while generating said second voltage control signal with said first value said controller means becomes not actively driven by said first voltage supply, to maintain said second voltage control signal at said first value.

24. A method of providing an interface between a first voltage domain and a second voltage domain, first voltage components in said first voltage domain connected to a first voltage supply and second voltage components in said second voltage domain connected to a second voltage supply, said method comprising the steps of:
receiving at a level shifter the second supply voltage and an input signal from said first voltage domain;
level shifting said input signal to provide an output signal for passing to said second voltage domain;

generating a second voltage control signal in said second voltage domain to said level shifter in response to at least one first voltage control signal from a controller coupled to receive the first supply voltage in said first voltage domain;

putting said level shifter into a retention state when said second voltage control signal has a first value, in which said output signal provided by said level shifter is held constant at the same value as the value of the output signal before the level shifter was configured to be in the retention state, putting said level shifter into a transmission state when said second voltage control signal has a second value, wherein said output signal depends on said input signal, and if while generating said second voltage control signal with said first value said controller becomes not actively driven by said first voltage supply, maintaining said second voltage control signal at said first value.

* * * * *